United States Patent [19]

Shimizu

[11] Patent Number: 4,663,644

[45] Date of Patent: May 5, 1987

[54] SEMICONDUCTOR DEVICE AND METHOD OF MANUFACTURING THE SAME

[75] Inventor: Shinji Shimizu, Hoya, Japan

[73] Assignee: Hitachi, Ltd., Tokyo, Japan

[21] Appl. No.: 686,601

[22] Filed: Dec. 26, 1984

[30] Foreign Application Priority Data

Dec. 26, 1983 [JP] Japan .................................. 58-243996

[51] Int. Cl.[4] ...................... H01L 29/78; H01L 29/06; H01L 27/02
[52] U.S. Cl. .................................. 357/23.14; 357/55; 357/23.4; 357/23.12; 357/41
[58] Field of Search ............... 357/55, 23.4, 49, 23.12, 357/41, 23.14; 365/103, 104, 63

[56] References Cited

U.S. PATENT DOCUMENTS

| | | | |
|---|---|---|---|
| 4,198,693 | 4/1980 | Kuo | 357/41 |
| 4,219,836 | 8/1980 | McElroy | 357/41 |
| 4,462,040 | 6/1984 | Ho et al. | 357/55 |
| 4,541,001 | 9/1985 | Schutten et al. | 357/55 |

FOREIGN PATENT DOCUMENTS 039579   3/1979   Japan .................................. 357/23.4

OTHER PUBLICATIONS

Rodgers et al., "VMOS Memory Technology", IEEE Journal of Solid-State Circuits, vol. SC-12, No. 5, Oct. 1977, pp. 515-523.

*Primary Examiner*—Martin H. Edlow
*Assistant Examiner*—Robert P. Limanek
*Attorney, Agent, or Firm*—Antonelli, Terry & Wands

[57] ABSTRACT

Disclosed are various semiconductor devices having vertical-type MISFETs wherein the source and drain regions of the MISFETs are spaced from each other in a direction perpendicular to the main surface of the semiconductor substrate containing such MISFETs. In a specific embodiment, a plurality of such MISFETs can be arrayed in a substrate, to form a memory device, with a common gate electrode, buried in the substrate, being used for a plurality of the memory cells, such buried gate electrode constituting the word line for the memory cells, with the data line extending over the surface of the substrate. This structure provides for increased miniaturization, without decrease in channel width of the MISFET, and provides for a flatter device surface due to the buried combination gate electrode/word lines.

17 Claims, 33 Drawing Figures

SEMICONDUCTOR DEVICE AND METHOD OF MANUFACTURING THE SAME

BACKGROUND OF THE INVENTION

The present invention relates to a semiconductor device which is well suited for application to a semiconductor memory device such as a ROM (Read Only Memory), and more particularly to a semiconductor memory device which achieves a higher packing density or an increased memory capacity by employing MOSFETs (MOS type field effect transistors) as its elements, and a method of manufacturing the same.

In general, semiconductor devices such as an IC and LSI have had enhancements in the packing density and the operating speed promoted more and more in recent years. Such progress in semiconductor devices is much indebted to the advancements of micro-processing techniques among the manufacturing techniques of the semiconductor devices. For example, in a semiconductor device whose circuit elements are MOSFETs, the working dimension of a gate electrode is often used as the representative of the micro-processing level of the whole semiconductor device. In addition, when the gate electrode length or the channel length is designed to be smaller, a device of higher integration can be constructed. By shortening the channel length, the "on" resistance of the MOSFET can be lowered. Also, for designing an IC of high speed, it is important to shorten the channel length.

However, when the channel length is shortened, the so-called short channel effect arises. The dependence of the threshold voltage ($V_{th}$) upon the channel length poses a problem. In order to cope with this, a countermeasure such as shallower source and drain regions is required.

On the other hand, photolithography is usually used for the formation of the gate electrodes, etc. Problems in this technique, such as the mask registration precision, and the developing and etching precisions, limit the microminiaturization of a pattern. Also, in forming the gate electrodes, it is very difficult to finely work the channel lengths at high precision. Consequently, the proper adjustment of the threshold voltage ($V_{th}$) becomes difficult.

A conventional MOS structure is such that wiring layers are formed on a semiconductor substrate in a stacked state. With the multilayering of wiring, the wiring layer on the upper side of a device is not as flat as desired, e.g., undesirably has steps. For this reason, drawbacks such as the disconnection and short-circuit of the upper layer wiring are liable to occur. Especially in a semiconductor memory device such as a ROM which needs a plurality of (a large number of) wiring leads in each of vertical and lateral directions in plan, the drawbacks of this sort are prone to occur conspicuously.

SUMMARY OF THE INVENTION

An object of the present invention is to microminiaturize MOSFET elements so as to achieve enhancement in the density of integration, and to simultaneously provide a semiconductor device comprising MOSFETs which can design channel lengths at will, whose characteristics can be stabilized and which can achieve enhancement in the density of integration.

Another object of the present invention is to provide necessary wiring yet dispense with the multilayering of wiring layers, thereby to provide a semiconductor device the surface of which can be flattened to prevent drawbacks such as disconnection and shortcircuit, and also to promote enhancement in the packing density of elements.

Further, an object of the present invention is to provide a ROM device of very large memory capacity.

Another object of the present invention is to provide a method of manufacturing a semiconductor device which reduces the number of photolithographic steps and steps of impurity doping, etching, etc., in comparison with those in a prior art, and which can manufacture the aforementioned semiconductor device very easily.

The above-mentioned and other objects and novel features of the present invention will become apparent from the description of this specification and the accompanying drawings.

An outline of a typical embodiment of the present invention disclosed in the present application will be briefly explained below. However, the present invention is not limited thereto.

Source and drain regions are formed in the vertical direction of a semiconductor substrate, a gate is formed on an insulator film so as to extend along the source and drain, and the gate is buried in the semiconductor substrate, whereby a MOSFET can be formed vertically of the semiconductor substrate, so that with a channel constructed in the vertical direction of the semiconductor substrate the MOSFET of a required channel can be formed in spite of the microminiaturization of the plane shape of the element, to render the area of the element very small and to stabilize characteristics.

Besides, a semiconductor substrate is doped with an impurity in advance, whereupon it is formed with a groove, an insulator film is formed on the inner surface of the groove, and a gate material is buried in the groove, whereby a MOSFET can be manufactured with a smaller number of steps than in using prior manufacturing procedures.

Further, one layer of wiring is laid on a MOSFET and is constructed as a data line, and a gate is constructed as a word line, whereby a ROM can be constructed, and besides, one pair of MOSFETs are opposingly formed on a single active region, so that the density of integration can be enhanced, i.e., the memory capacity can be doubled.

DETAILED DESCRIPTION OF THE INVENTION

Figure 1:
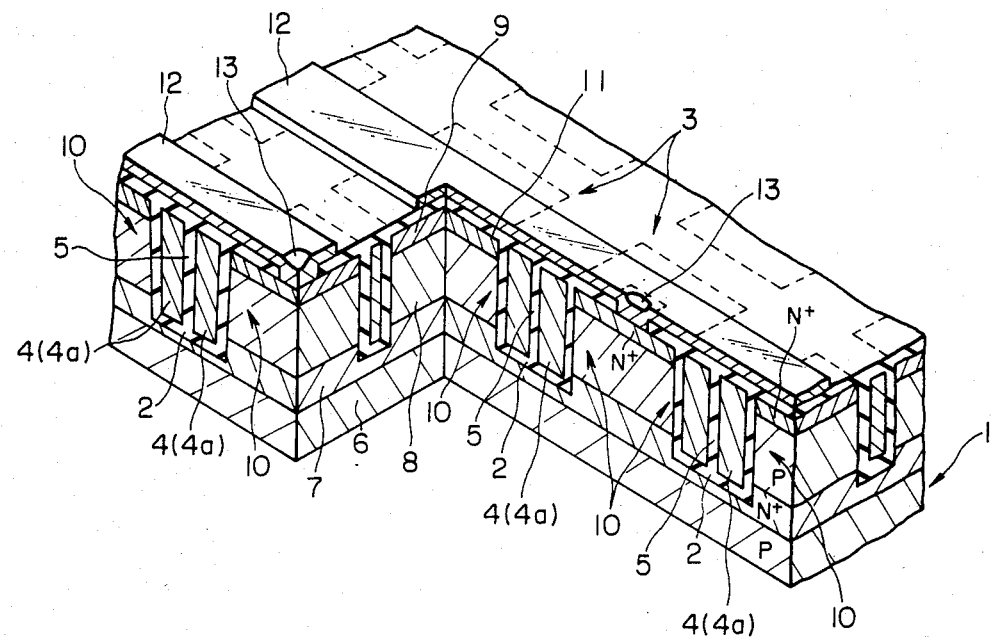
FIG. 1 is a sectional perspective view of a first embodiment of the present invention.
Figure 2:
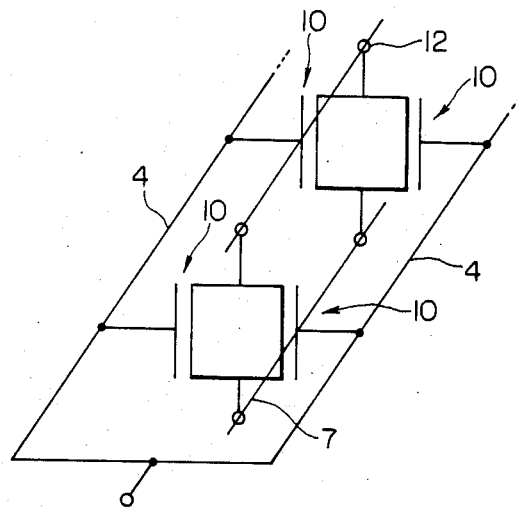
FIG. 2 is an equivalent circuit diagram thereof.

FIG. 1 is a sectional perspective view of a ROM structure which is an embodiment of the present invention. As shown in the figure, active regions 3 whose peripheries are insulated by an $SiO_2$ film 2 and which have a square plane shape are formed in the shape of a matrix in the main surface portion of a silicon body 1. Further, grooves formed between the active regions 3 are filled up with polycrystalline silicon to form gates 4a as word lines 4. In this case, the polycrystalline silicon 4a in each groove is constructed as the gates 4a (word lines 4) isolated from each other and parallel to each other, by an $SiO_2$ film 5 which is extended unidirectionally within the groove. As a result, the respective word lines 4 are ladder-shaped in plan (refer to FIG. 3). Meanwhile, in the active region 3, a P-type silicon semiconductor substrate 6 is overlaid with an $N^+$-type layer 7, a P-type layer 8 and an $N^+$-type layer 9 in this order from below. The $N^+$-type layer 7 is a ground line and is connected with Al leads (not shown) providing the ground potential formed on the surface of the body 1 through N-type layer (not shown) formed in the P-type layer 10. These conductive layers 7, 8, 9, the $SiO_2$ film 2 and the gates 4a construct one pair of opposing vertical MOSFETs (MOS field effect transistors) 10, 10 in each active region 3. In addition, an interlayer film such as $SiO_2$ film 11 is formed over the active regions 3 and the word lines 4. On the $SiO_2$ film 11, Al leads as data lines 12 are extended in a direction intersecting the word lines 4. In accordance with information to be written, contact holes 13 are provided on the active regions 3, thereby to connect these regions with the data lines 12. Thus, the information as a mask ROM is written. Since, in this case, the word line (gate 4a) 4 is common to the MOSFETs 10 of the same active region 3, one memory cell is constructed of the MOSFETs 10. In FIG. 1, one pair of MOSFETs 10, 10 seem as if they were one memory cell. A typical equivalent circuit of this ROM structure is shown in FIG. 2.

Next, a method of manufacturing the ROM structure will be described with reference to plan views and vertical sectional views shown in FIGS. 3 and 4.

Figure 3A:
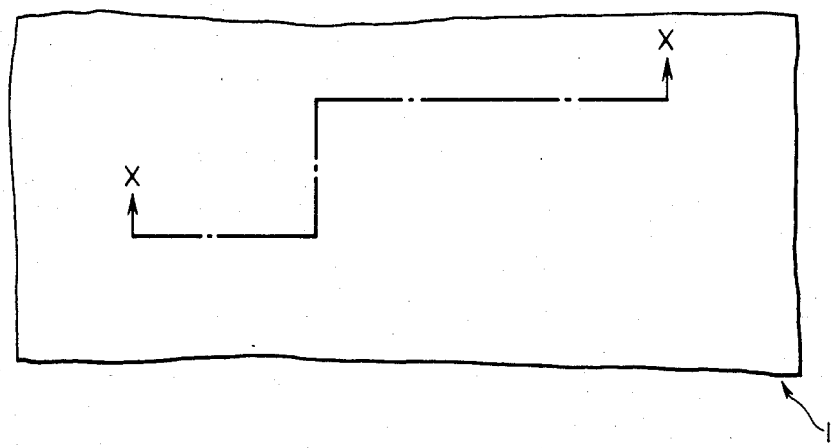
FIGS. 3(A)-(E) are plan views which show a step-by-step manufacturing method for forming the structure of the first embodiment.
Figure 4A:
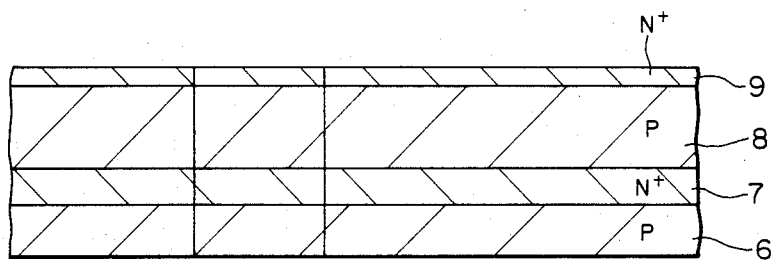
FIGS. 4(A)-(E) are sectional views taken along lines X—X in FIGS. 3(A)-(E), respectively.

First, as shown in FIGS. 3(A) and 4(A), a P-type layer 8 is epitaxially grown on a P-type silicon semiconductor substrate 6. On this occasion, an N-type impurity such as As or Sb is diffused in the surface of the substrate 6 beforehand so as to form an $N^+$-type layer as an $N^+$-type layer 7 ($10^{19}-10^{20}$/cm$^3$). After the P-type layer 8 has been formed, another $N^-$-type layer 9 ($10^{20}$/cm$^3$) is formed by diffusing an N-type impurity, for example, arsenic from above. Thus, a silicon body 1 which has the respective layers of P, $N^+$, P and $N^+$ from below is formed. The $N^+$-type layer 9 may well be formed by a later step.

Figure 3B:
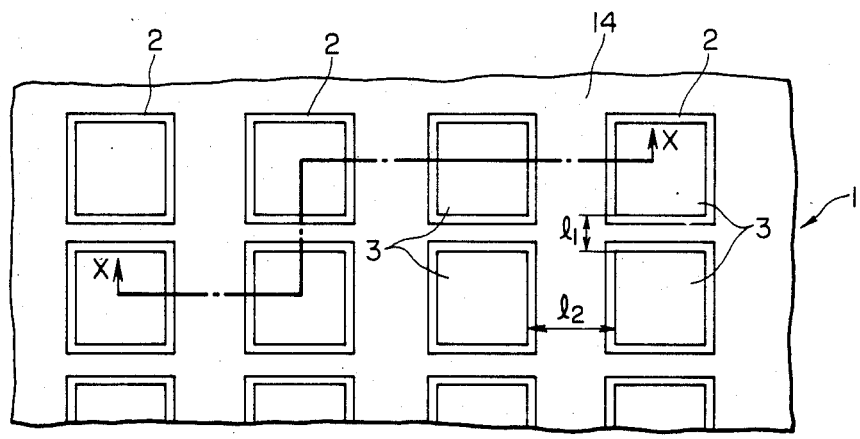
Figure 3C:
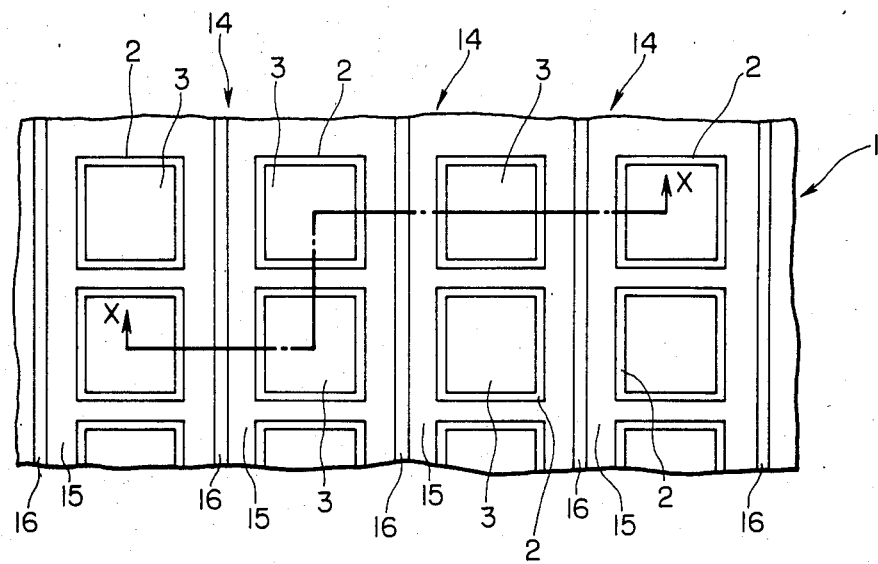
Figure 4B:
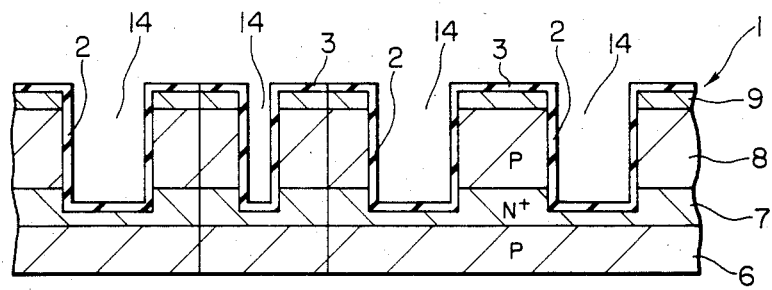

Subsequently, a mask made of meshy $SiO_2$ films is formed on the silicon body 1 by photolithography, whereupon the silicon body 1 is etched by, for example, RIE (reactive ion etching). This etching is performed down to a depth at which parts of the lower $N^+$-type layer 7 are etched and removed to the depth of 2000 Å, as shown in FIGS. 3(B) and 4(B). It is carried out in a pattern which is checkered in plan. Thus, checkered grooves 14 are formed. At this time, the interval between the active regions 3, namely, the widthwise dimension of the groove 14, is so set that the ratio between a vertical dimension $l_1$ (0.8 μm) as viewed from above and a lateral dimension $l_2$ (2.0 μm) as viewed from above (see FIG. 3(B)) is less than $\frac{1}{2}$. Thus, when trenches of width $l_1$, are filled, the gap 16 must remain in the trenches of $l_2$, and, accordingly, $l_2$ must be more than $2l_1$. A plurality of active regions 3 made of the silicon body 1, which are correspondingly left in a square plane shape, are arrayed and formed in the shape of a matrix. Thereafter, the silicon body 1 is subjected to a thermal oxidation treatment, to form $SiO_2$ films a (250 Å) on the surface of the silicon body 1 including the inner surfaces of the grooves 14.

Figure 3D:
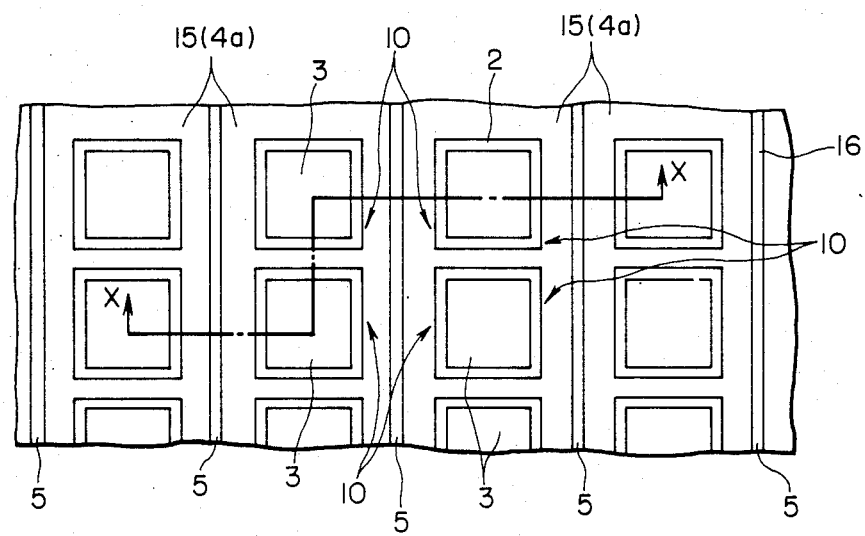
Figure 4C:
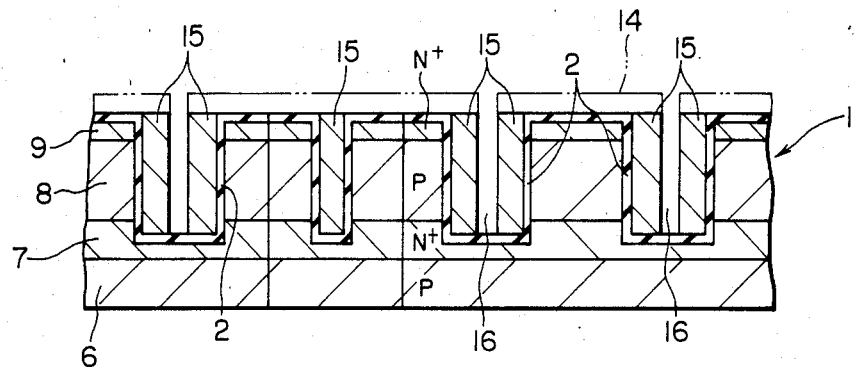
Figure 4D:
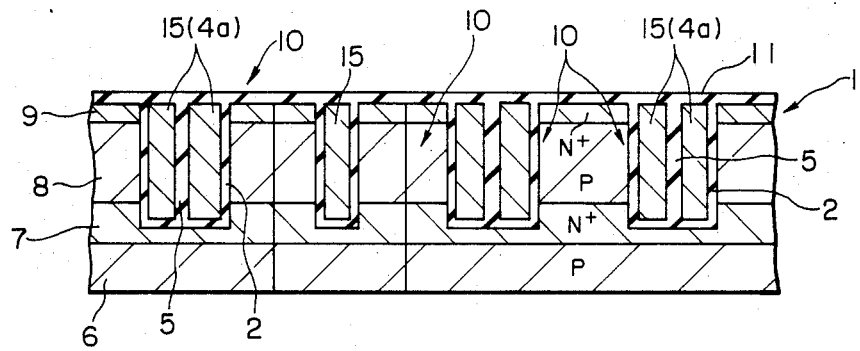

Next, as indicated by phantom lines in FIG. 4(C), polycrystalline silicon of 8000 Å thick which is doped with an impurity (phosphorus) to have its resistivity lowered is deposited by CVD on the whole surface. Thereafter, the polycrystalline silicon is etched by the RIE process, removing polycrystalline silicon from the surface of the silicon body and from the bottom of the grooves (to form the gap extending down to the bottom of the grooves). Thus, a state in which the polycrystalline silicon 15 is deposited on only the side surfaces of the inner surfaces of the grooves 14 is established as indicated by solid lines in FIGS. 3(C) and 4(C). In this way, the polycrystalline silicon 15 is deposited in a continuous state in the vertical direction as viewed from above, but a gap 16 is formed between the polycrystalline silicon parts 15, 15 opposed within the groove 14 in the lateral direction as viewed from above. Subsequently, the surfaces of the polycrystalline silicon parts 15, 15 are subjected to a thermal oxidation treatment. As shown in FIGS. 3(D) and 4(D), the gap 16 between the polycrystalline silicon parts 15, 15 is filled up with an $SiO_2$ film 5 which has been produced by the surface oxidation of the polycrystalline silicon parts 15, 15. The polycrystalline silicon is entirely buried by an $SiO_2$ film 11 which has been formed on its surface simultaneously with the $SiO_2$ film 5. As a result, the adjacent polycrystalline silicon parts are insulated from each other in the lateral direction as viewed from above, but they are a continuous electrical conductor in the vertical direction as viewed from above. That is, the polycrystalline silicon is formed as polycrystalline silicon conductor layers whose plane shape is ladder-like, namely, as ladder-shaped word lines 4 (gates 4a). The $N^+$-type layer 9 may well be formed by ion implantation under this state. In this case, a mask is unnecessary within the memory cell array of a mask ROM.

The polycrystalline silicon parts 15, 15 are formed within the groove 14 as described above, with the result that, as viewed from above, the polycrystalline silicon inside the groove 14 is disposed beside the $N^+$-type layer 7, P-type layer 8 and $N^+$-type layer 9 of each active region 3, on the $SiO_2$ film 1. Therefore, a MOSFET 10 is constructed in which the $N^+$-type layers 7 and 9 are source and drain regions, the $SiO_2$ film 2 is a gate insulator film and the polycrystalline silicon 15 is the gate electrode 4a. The lower N+-type layer 7 is common to all the MOSFETs 10, and the gate electrodes 4a adjacent in the groove are unidirectionally insulated within the groove 14 by the SiO₂ film 5 between the polycrystalline silicon parts. In contrast, in a direction orthogonal to the direction in which the gate electrodes are insulated from each other, the poly crystalline silicon is constructed as the word line 4 for connecting the MOSFETs.

Figure 3E:
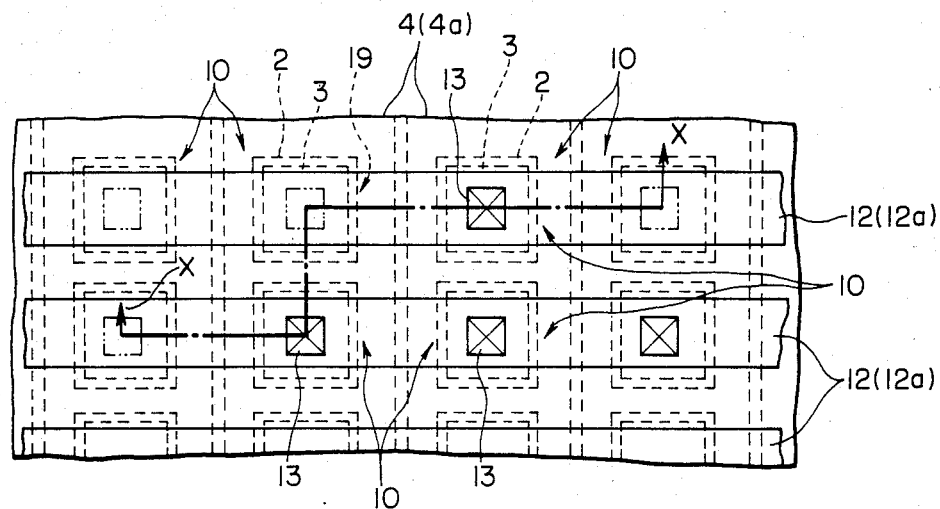
Figure 4E:
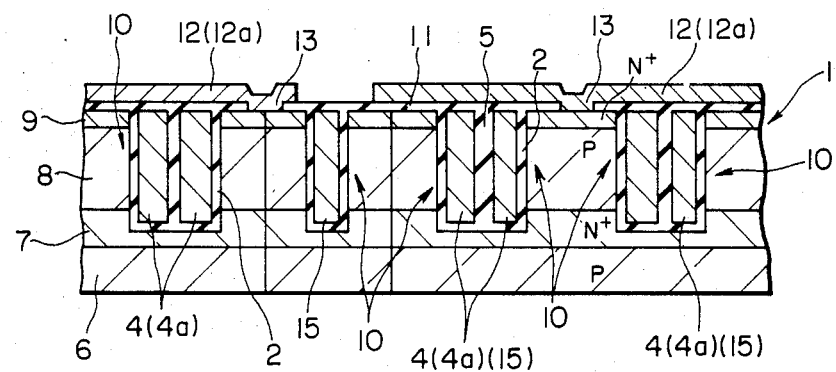

Next, referring to FIGS. 3(E) and 4(E), an interlayer insulator film (not shown) is formed on the silicon body 1 as may be needed. Thereafter, in accordance with information to be written, the inter-layer insulator film and the SiO₂ film 11 which overlie desired ones of the active regions 3 are provided with contact holes 13 by photoetching. An Al wiring 12a extended on the resultant body laterally in plan and the upper N+-type layer 9 are connected through the contact hole 13. The Al wiring 12a is constructed as a data line 12. Thus, the mask ROM can be finished up in which the information "1" or "0" has been written by the presence or absence of the contact hole 13.

According to the above ROM structure, each of the active regions 3 formed in the shape of the matrix can be constructed as 1 unit (1 bit) of the memory cell, and the MOSFET thereof includes a channel in the thickness direction of the silicon substrate 1. For this reason, even when the plane shape of the active region is microminiaturized, the channel length need not be shortened, so that while enhancement in the density of integration is achieved, drawbacks attributed to a short channel, such as lowering in the breakdown voltage, do not occur. Moreover, the structure is advantageous for lowering the resistivities of the layers and enhancing the operating speed. Further, the word lines 4 are buried in the silicon body 1, and only the data lines 12 are formed on the surface. Thus, the flattening of the surface is promoted, and the reliability against disconnection, short-circuit, etc. can be enhanced. Further, the number of masks required for the formation of the MOSFETs can be reduced, and techniques such as selective impurity doping can be dispensed with, so that MOSFETs of very fine pattern can be readily formed. In case of the present example, it can also be said that the MOSFETs are constructed along the whole side walls of the active region 3.

Figure 5:
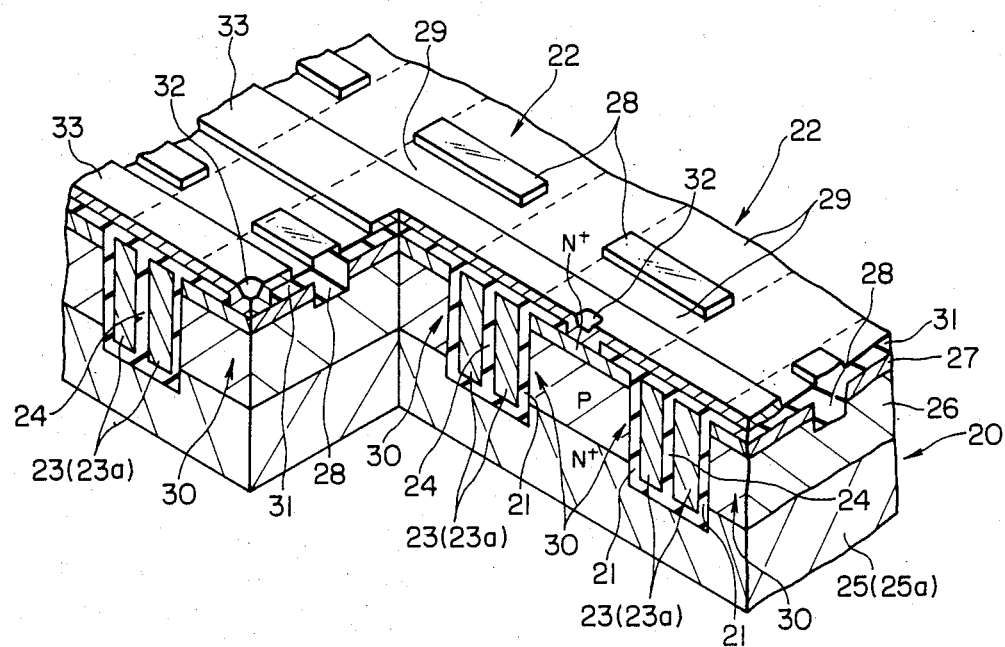
FIG. 5 is a sectional perspective view of a second embodiment of the present invention.

FIG. 5 is a sectional perspective view of a ROM structure which is another embodiment of the present invention. As shown in the figure, regions 22, which are insulated so as to be held between SiO₂ films 21, 21, are extended on the main surface portions of a silicon semiconductor body 20, in the state of a plurality of columns in one direction (vertical direction) as viewed from above. Buried between the adjacent regions 22 are gate electrodes 23a, 23a as word lines 23, 23, which are made of polycrystalline silicon extended in parallel with the SiO₂ film 21. The word lines 23, 23 formed in a single groove are insulated by an SiO₂ film 24 which is deposed between them. Thus, one pair of word lines 23, 23 are disposed so as to sandwich therebetween the corresponding region 22 which extends in the shape of the column unidirectionally.

Figure 6:
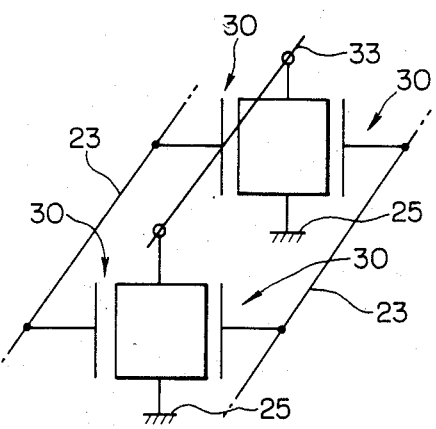
FIG. 6 is an equivalent circuit diagram thereof.

The silicon body 20 is such that a P-type epitaxial layer 26 is formed on an N+-type silicon semiconductor substrate 25a and that an N+-type layer 27 is formed thereon by diffusing an N-type impurity. Owing to the substrate 25a, epitaxial layer 26 and diffused layer 27, the region 22 is formed with the N+-type layer 25, P-type layer 26 and N+-type layer 27 in succession. On the surface of each region 22, element isolating SiO₂ films 28 (0.6 μm–0.8 μm thick) are formed at equal intervals in the vertical direction as viewed from above (in the direction orthogonally intersecting the word lines), and a region located between the adjacent element isolating SiO₂ films 28 is constructed as an active region 29. In this case, the element isolating SiO₂ film 28 is formed deeper than the N+-type layer 27 (0.3 μm deep). The N+-type layer 27 may well be formed by impurity doping after the element isolating SiO₂ films 28 have been formed. The essential point is that the adjacent portions of the N+-type layer 27 are isolated at intervals of 1.0 μm by the SiO₂ films 28. In the active region, one pair of vertical MOSFETs 30, 30 are constructed so as to oppose laterally, owing to the N+-type layer 25, P-type layer 26 and N+-type layer 27 and the SiO₂ films 31 as well as the word lines (gates 23a) 23. An SiO₂ film 31 is formed on the silicon body 20, and if necessary, a PSG film is formed thereon as an interlayer insulator film. In accordance with information to be written, contact holes 32 are provided in positions on the active regions 29. Thereafter, data lines 33 made of Al wirings are extended in the direction orthogonal to the word lines 23. Thus, a mask ROM in which the desired information has been written can be constructed. A typical equivalent circuit diagram of this device is shown in FIG. 6. In the present example, one pair of MOSFETs 30, 30 which are opposingly disposed in the active region 29 are respectively provided with the gates 23a, 23a independently. Since, however, the MOSFETs have the data line 33 connected thereto through the identical contact hole 32, they operate in the status of information "1" and function as a memory cell of 1 unit (1 bit). When the data line 33 is not connected, both the MOSFETs 30, 30 are unitarily held in the status of information "0".

Next, a method of manufacturing the above ROM structure will be described with reference to plan views and sectional views shown in FIGS. 7 and 8.

Figure 7A:
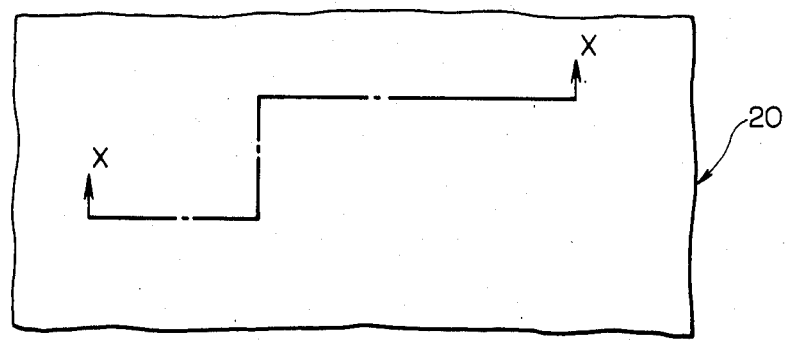
FIGS. 7(A)-(E) are plan views which show a step-by-step manufacturing method for forming the second embodiment.
Figure 8A:
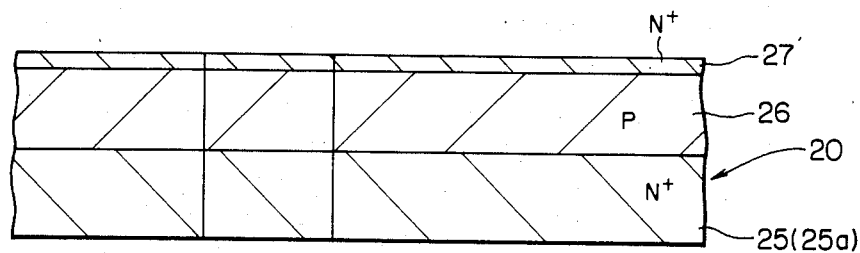
FIGS. 8(A)-(E) are sectional views taken along lines X—X in FIGS. 7(A)-(E), respectively.

First, as shown in FIGS. 7(A) and 8(A), a P-type epitaxial layer 26 is formed on an N+-type silicon semiconductor substrate 25a as an N+-type layer 25, and an N-type impurity is diffused into the upper part thereof. Thus, a silicon body 20 is constructed which has a structure consisting of the N+-type layer 25, the P-type layer 26 and an N+-type layer 27 in succession from below. As stated before, the formation of the N+-type layer 27 may well be executed after an element isolating SiO₂ film 28 has been formed.

Figure 7B:
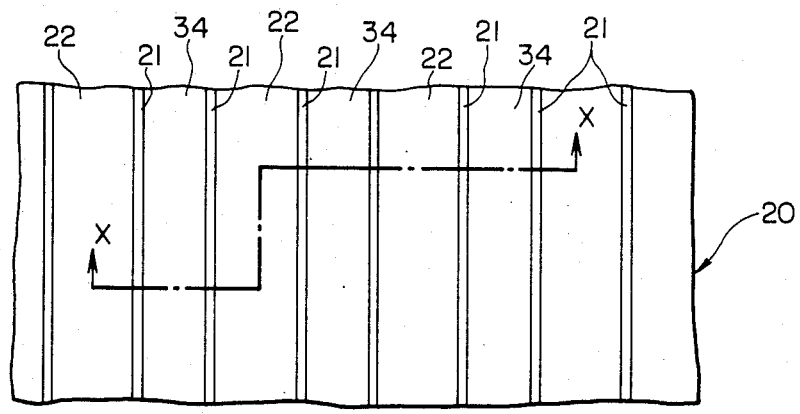
Figure 7C:
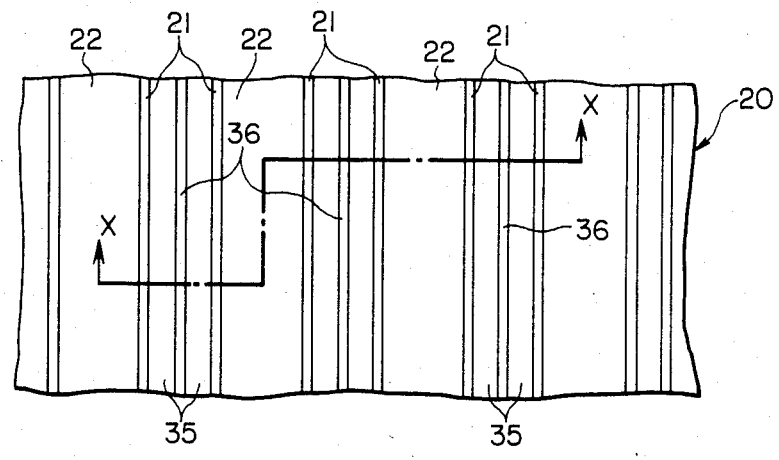
Figure 8B:
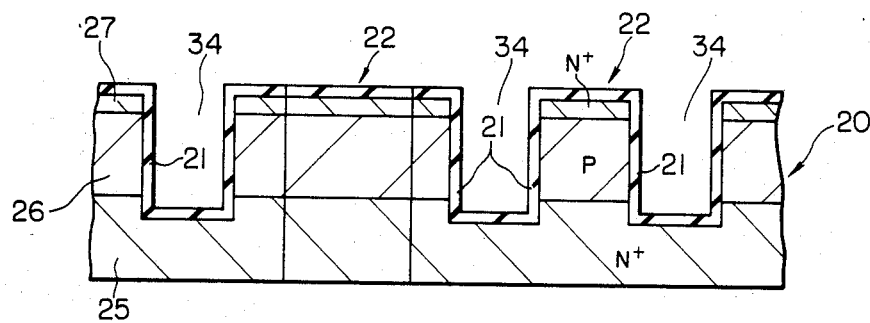

Subsequently, as shown in FIGS. 7(B) and 8(B), a plurality of grooves 34 having a required widthwise dimension are etched and formed at proper intervals in vertical and lateral directions by utilizing a mask of SiO₂. Regions 22 which are made of the silicon body 20 correspondingly left are extended. The grooves 34 are formed by, e.g., the RIE process, down to a depth such that the grooves extend into the lower N+-type layer 25. Thereafter, the exposed surface of the silicon body is subjected to a thermal oxidation treatment so as to form an SiO₂ film 21 on the whole surface.

Figure 7D:
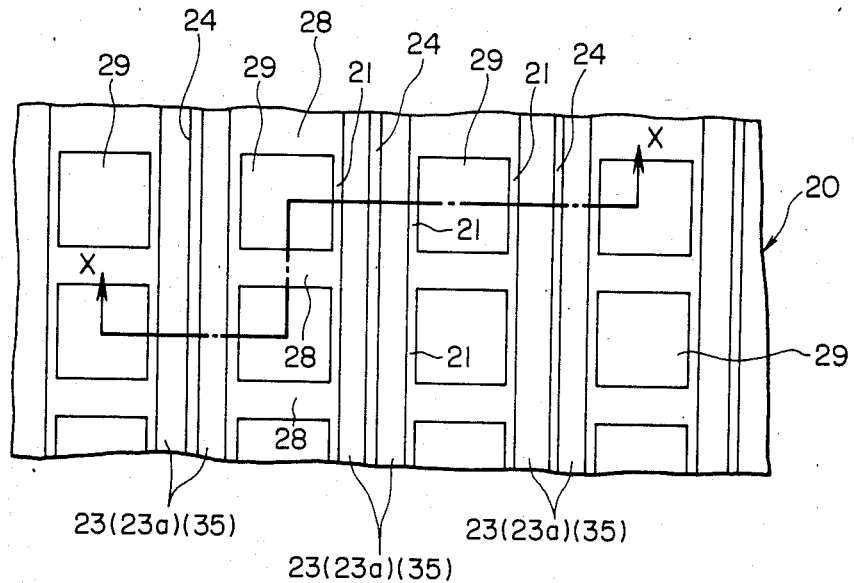
Figure 8C:
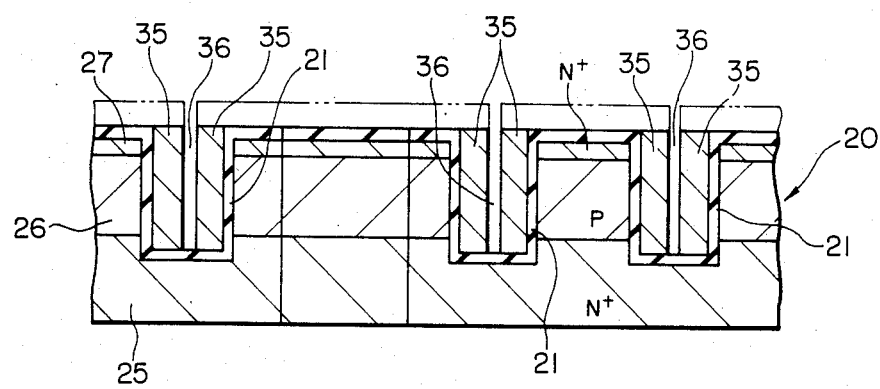
Figure 8D:
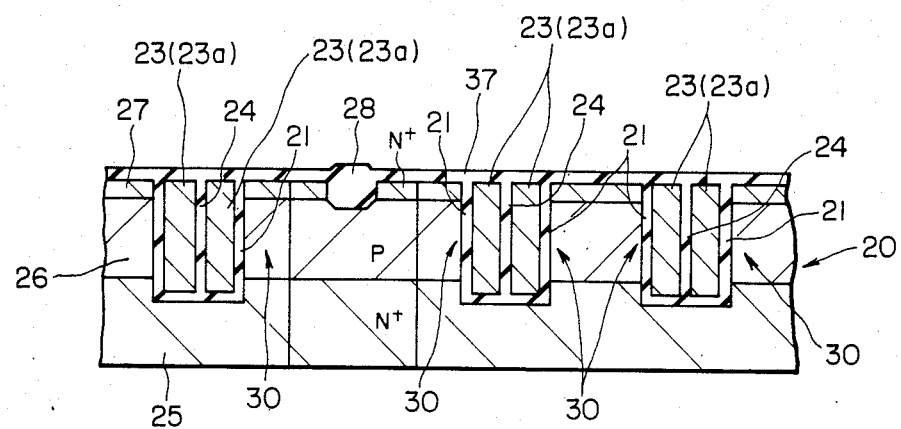

Next, as indicated by phantom lines in FIG. 8(C), polycrystalline silicon which is doped with an impurity (phosphorus) to have its resistivity lowered is deposited and formed on the whole surface. Thereafter, the polycrystalline silicon is etched by the RIE process. Thus, as indicated by solid lines in FIGS. 7(C) and 8(C), polycrystalline silicon parts 35, 35 are formed within the groove 34 in a state in which they are stuck to side surfaces within the groove. Moreover, a gap 36 is formed in the part between the polycrystalline silicon parts in the widthwise direction of the groove. The surfaces of the polycrystalline silicon parts 35, 35 are subjected to a thermal oxidation treatment, to fill up the gap 36 with an $SiO_2$ film 24 which has been produced by the surface oxidation of the polycrystalline silicon parts 35, 35, as illustrated in FIGS. 7(D) and 8(D). After the oxidation treatment, the exposed part of the $SiO_2$ film is once removed. Thereafter, the main surface portions of the regions 22 made of the exposed silicon body 20 are oxidized at required intervals by conventional local oxidation which uses an $Si_3N_4$ film as an oxidation impermeable mask. Thus, the element isolating $SiO_2$ films 28 can be formed as shown in the figures. Each region 22 is divided by the $SiO_2$ film 28 in a direction orthogonally intersecting the direction in which the region 22 extends, whereby active regions 29 are defined. Thereafter, thermal oxidation is performed anew, to form a thin $SiO_2$ film 37 on the surface of the silicon body 20 except the $SiO_2$ film 28. Then, the polycrystalline silicon parts 35, 35 are buried. The polycrystalline silicon parts 35, 35 extend vertically on both sides of the region 22 in a manner to sandwich it therebetween. They are constructed as word lines 23, 23. It is important that the element isolating $SiO_2$, films 28 are formed deeper than the upper $N^+$-type layer 27.

The word lines 23, 23 of polycrystalline silicon are formed as described above, with the result that one pair of vertical MOSFETs 30, 30 which employ the upper and lower $N^+$-type layers 25, 27 as source and drain regions, the $SiO_2$ film 21 as a gate insulator film and the word lines 23, 23 as gate electrodes are formed in each active region 29 so as to oppose each other.

Figure 7E:
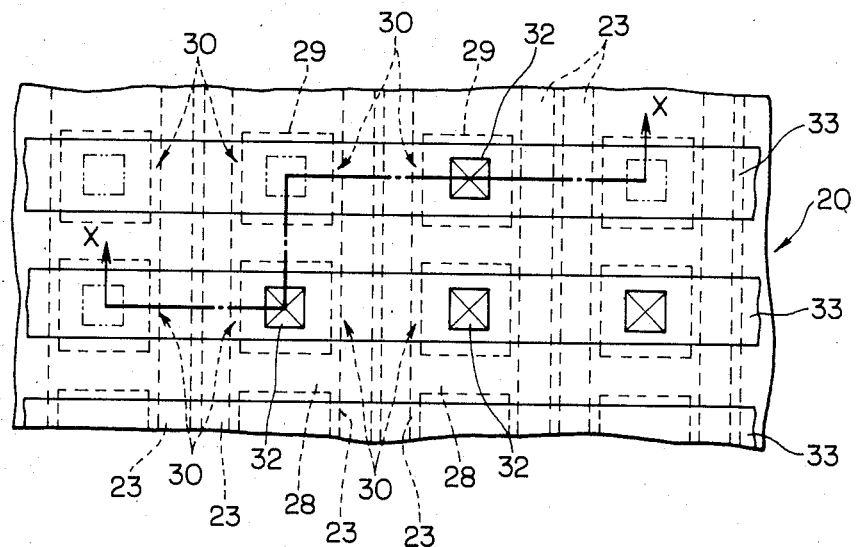
Figure 8E:
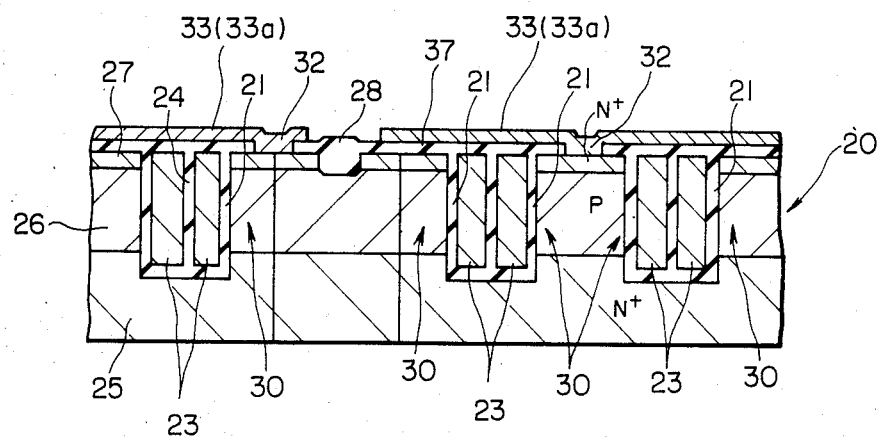

Subsequently, referring to FIGS. 7(E) and 8(E), a PSG (phosphosilicate glass) film (not shown) is formed on the silicon body 20 as may be needed. In accordance with information to be written, the $SiO_2$ film 37 which overlies desired ones of the active regions 29 is provided with contact holes 32. Thereafter, Al wirings 33a extended laterally, as viewed from above, are connected to the upper $N^+$-type layer 27 through the contact holes 32. The Al wirings 33a are constructed as data lines 33. Thus, the mask ROM can be constructed in which the information "1" or "0" has been written by the presence or absence of the contact hole 32.

According to the above ROM structure, the MOSFETs 30, 30 constructed in each active region 29 have the vertical structure likewise as in the foregoing example. For this reason, even when the plane structure is microminiaturized, the channel length need not be shortened. While enhancement in the density of integration is achieved, favorable MOS characteristics can be secured. Effects such as the enhanced speed of the device and the flattening of the surface, and effects such as the facilitation of the manufacture are the same as in the foregoing example. The MOSFETs of the active regions isolated by the element isolating $SiO_2$ film 28 in the vertical direction as viewed in plan do not interfere with each other as long as the element isolating $SiO_2$ film 28 is formed deeper than the upper $N^+$-type layer 27.

Figure 9:
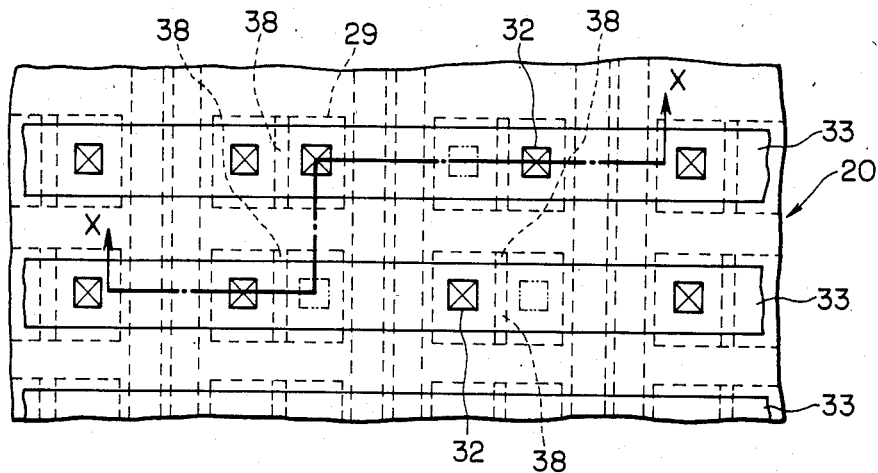
FIG. 9 is a plan view of a modification of of the second embodiment.
Figure 10:
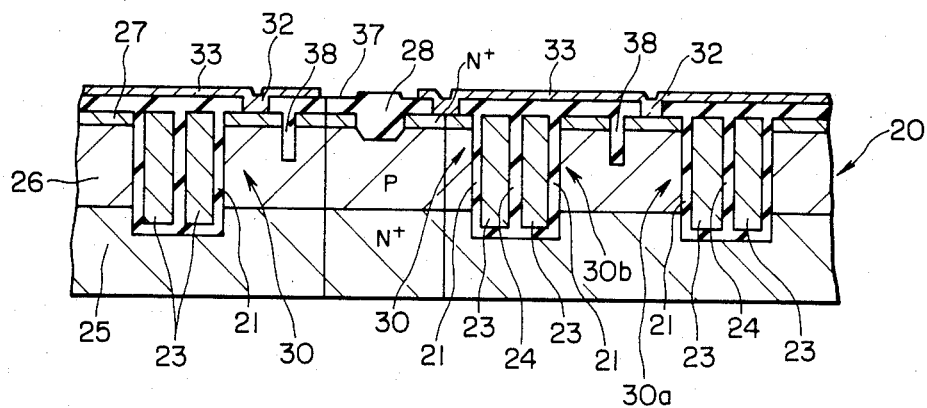
FIG. 10 is a sectional view taken along line X—X in FIG. 9.

FIGS. 9 and 10 show still another embodiment of the present invention. In particular, they show a modification of the second embodiment stated above. In these figures, the same parts as in the foregoing example (the structure of FIG. 5) are assigned the identical symbols.

Figure 11:
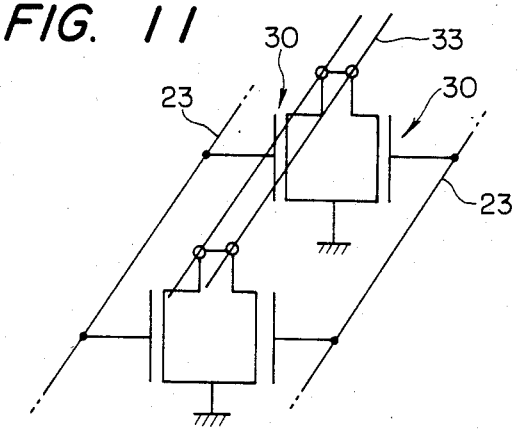
FIG. 11 is an equivalent circuit diagram thereof.

The present example is characterized in that, in the upper surfaces of the middle parts of the respective active regions 29 in the lateral direction, as viewed from above, grooves (termed "$SiO_2$ grooves") 38 filled up with $SiO_2$ are formed in the vertical direction as viewed from above. The $SiO_2$ groove 38 is formed deeper than the upper $N^+$-type layer 27, whereby the MOSFETs 30, 30 opposingly formed in each active region 29 are electrically isolated. Accordingly, when the contact holes 32 for the Al wiring as the data line 33 formed on the upper surface are formed in respective positions holding the $SiO_2$ groove 38 therebetween, the individual MOSFETs 30, 30 in each active region 29 can be constructed as completely independent memory cells. Even in the same active region 29, accordingly, information can be written in accordance with the presence or absence of the formation of the contact hole 32, for example, the MOSFET 30a on the side formed with the contact hole 32 can be brought into status "1", while the MOSFET 30b having no contact hole into status "0". An equivalent circuit of the present example is shown in FIG. 11.

Figure 12:
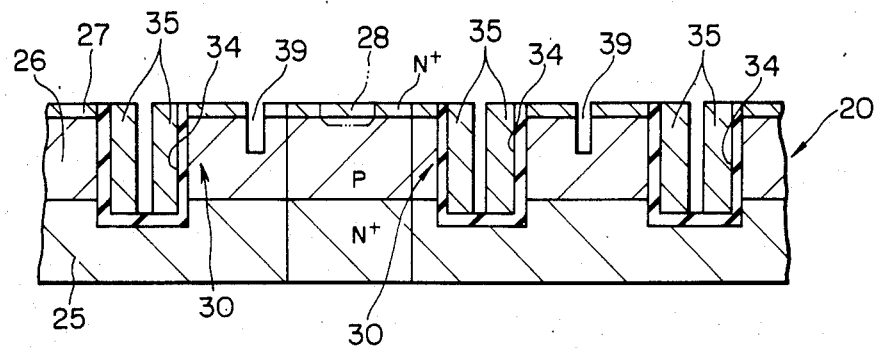
FIG. 12 is a view similar to FIG. 10, showing one step of a manufacturing method for forming the modification of the second embodiment.

As a method of manufacturing the above ROM structure, the following method is adopted. By way of example, before the step of FIG. 8(D) in the preceding embodiment, notches 39 are formed centrally of the regions 22 and in parallel with the grooves 34 as illustrated in FIG. 12 by etching (RIE) which employs $SiO_2$ for a mask. The width and depth of notches 39 are 0.5 $\mu$m and 1.0 $\mu$m, respectively. Simultaneously with the formation of the element isolating $SiO_2$ film 28, or simultaneously with the subsequent formation of the surface $SiO_2$ film 37, the silicon surfaces within the notches 39 are oxidized to fill up these notches with $SiO_2$, whereby the $SiO_2$ grooves 38 are constructed.

According to this ROM structure, two perfectly independent MOSFETs 30, 30 can be constructed for the single active region 29, and each of the MOSFETs can be utilized as an individual memory cell. For this reason, the memory capacity can be substantially doubled, and the density of integration can be further enhanced. Besides, the manufacturing process requires only to add and form the $SiO_2$ grooves 38, and the number of steps is not sharply increased with respect to that in the foregoing embodiment. In points of the dimensional and positioning accuracies of the contact holes, however, in the present embodiment, it is sometimes necessary to render the vertical and lateral dimensions (especially, lateral dimension) of the active region 29 in plan somewhat larger than in the preceding embodiment.

Figure 13:
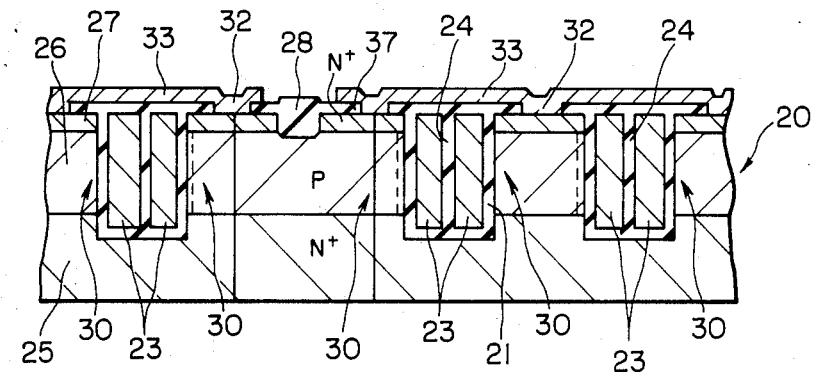
FIG. 13 is a sectional view of still another modification of the second embodiment.

FIG. 13 shows a ROM structure which is a further modification of the embodiment in FIG. 5, and in which information "1" or "0" is read out through the control of the threshold voltage ($V_{th}$) of a MOSFET. The same parts as in FIG. 5 are assigned identical symbols.

The MOSFETs 30, 30 formed in each active region 29 in the opposing state are classified as illustrated in FIG. 13 into two types; one in which the impurity doping quantity of the channel portion (P-type layer 26) is large, and the other in which it is small, so that the threshold voltage ($V_{th}$) of the respective types differ. The contact holes 32 are formed in those parts of the $SiO_2$ film 37 on the active region 29 which correspond to the respective MOSFETs 30, 30. The parts of the $N^+$-type region 27 within one active region 29 are connected through the same contact hole 32 to the Al wiring as the data line 33 which is laterally extended.

Figure 14:
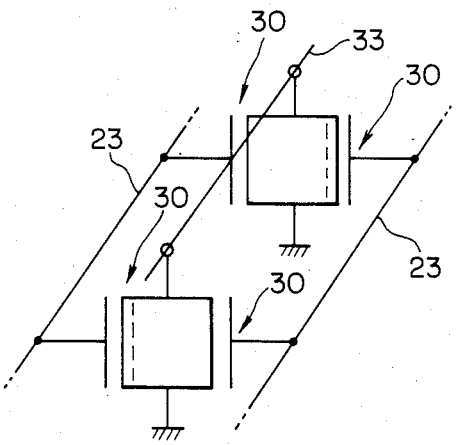
FIG. 14 is an equivalent circuit diagram thereof.

An equivalent circuit of the present example is shown in FIG. 14.

Figure 15A:
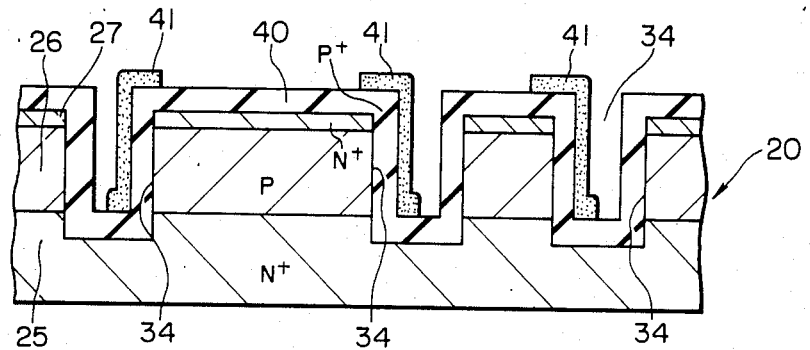
FIGS. 15(A)-(C) are views similar to FIG. 8, showing parts of the manufacturing method thereof.
Figure 15B:
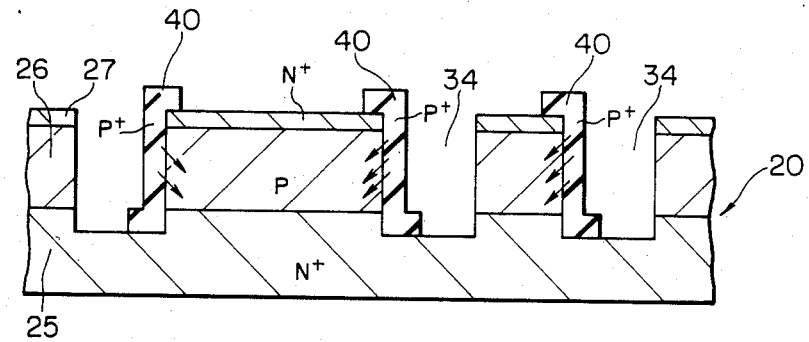
Figure 15C:
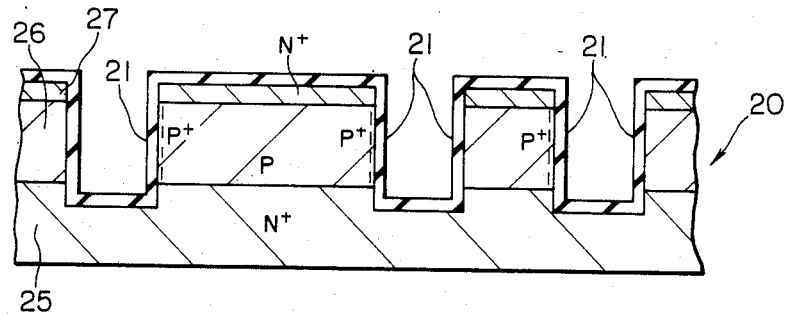

A method of manufacturing this ROM structure is illustrated in FIGS. 15(A)-(C).

First, as shown in FIG. 15(A), the grooves 34 which extend in the vertical direction as viewed from above and which are similar to those in FIG. 8(B) are formed, whereupon a glass film (silicon dioxide film) 40 doped with a required impurity such as B is formed on the whole surface before the SiO$_2$ film 21 is formed on the inner surfaces of the grooves. Thereafter, a mask 41 formed of a photoresist film by way of example is deposited and formed on each part corresponding to the MOSFET whose threshold voltage ($V_{th}$) is to be rendered high. Using the mask, dry etching is performed. Thus, the glass film 40 is left only in required places as shown in FIG. 15(B). After removing the mask 41, the resultant structure is annealed (900° C., 30 min) in N$_2$ and O$_2$ gases to diffuse the impurity in the glass film 40 into each region 29 to which the film itself is stuck, thereby to raise the impurity concentration to $10^{17}$/cm$^3$ of this part. Thereafter, the glass film 40 and SiO$_2$ film are removed by etching, and the SiO$_2$ film 21 is formed on the entire surface. Then, as shown in FIG. 15(C), the structure becomes the same as in FIG. 8(B). Thenceforth, the device is manufactured as in FIGS. 8(C)-(E), whereby the mask ROM structure of the present example is finished up.

The ROM structure of the present example can bring forth the various effects such as enhancement in the density of integration, enhancement in device characteristics and in flattening of the surface, likewise as in the respective embodiments stated before. In addition, the number of manufacturing steps is not sharply increased. Further, the present example reads out information on the basis of the difference of the threshold voltages ($V_{th}$), so that even when only one contact hole 32 is formed in each active region 29, the individual MOSFETs 30, 30 opposingly formed can function as unit memory elements which are perfectly independent of each other. Thus, the active region 29 may have plane dimensions enough to form one contact hole, so that it can be microminiaturized while the memory capacity can be doubled, whereby a MOS structure of very high density can be put into practical use.

Utilizing the present invention, the following advantageous and beneficial results can be obtained:

(1) Source and drain regions are formed in the vertical direction within a silicon body (particularly to the main surface plane of the silicon body), and a gate electrode is disposed by the side of the source and drain through an insulator film so as to stride over them, whereby a vertical MOSFET is constructed. Therefore, even when the element is scaled down for microminiaturization, the channel length need not be correspondingly set at a very small dimension but can be set at a desired dimension. Accordingly, enhancement in the packing density of the elements can be achieved on the one hand, while the proper characteristics of the MOSFETs can be secured on the other hand.

(2) In spite of the microminiaturization of the elements, the source and drain regions can be set at any desired dimension in the thickness direction of the silicon body. Therefore, increase in the resistivity of the source and drain regions attendant upon scalingdown does not occur, and high speed operation of the element can be ensured.

(3) Since word lines constructing the gates are buried in the grooves of the silicon body, only data lines need be provided on the surface of the silicon body. Thus, the surface of the body is flattened, and the accidents, such as disconnection and shortcircuit, of the data lines and wiring further formed thereon as may be needed are prevented, so that enhancement in the reliability can be attained.

(4) Since the MOSFETs are constructed on the respective opposing side surfaces of each of the active regions defined in the silicon body, it is also possible to construct two memory elements in one active region, and the memory capacity can be doubled with the enhancement in the density of integration.

(5) With a construction wherein one pair of MOSFETs formed in the active region are electrically isolated and wherein contacts with the data lines can be established in correspondence with the respective MOSFETs, the individual MOSFETs can be utilized as the memory elements perfectly independently, and the doubling of the memory capacity can be actualized.

(6) One pair of MOSFETs formed in the active region can have their threshold voltages adjusted independently of each other, so that even when one contact hole is provided for each active region, the respective MOSFETs can be utilized as independent memory elements. Moreover, since the size of the active region need not be enlarged, the density of integration can be enhanced even more.

(7) In manufacturing the memory elements, the number of photolithographic steps can be rendered much smaller than that required by prior manufacturing processes. Thus, reduction in the number of masks or the number of mask aligning steps is attained along with reduction in the number of manufacturing steps, so that the manufacture can be facilitated and that the microminiaturization of element patterns can be realized.

(8) Since the source and drain regions are previously formed in forming the silicon body, the controls of the impurity concentration of the regions and the channel length are facilitated, and MOSFETs of stable characteristics can be constructed.

(9) When the MOSFETs are constructed as the memory elements of a ROM, a ROM which has a high density of integration and stable characteristics, and which is easy of manufacture, can be constructed.

While, in the above, the invention made by the inventor has been concretely explained on the basis of embodiments thereof, it is needless to say that the present invention is not restricted to the foregoing embodiments, but that it can be variously modified within a scope not departing from the subject matter thereof. For example, the polycrystalline silicon for the word lines may well be replaced with a metal, especially a refractory metal or any metal silicide thereof. In addition, the element isolating SiO$_2$ film may well be replaced with the so-called U-groove type isolation. Further, MOSFETs may well be of a P-channel MOSFET structure, and they can be utilized, not only as the memory elements, but also as the elements of peripheral circuits. In this case, a complementary MOS structure can also be established by utilizing a well structure.

Although, in the above description, the invention made by the inventor has been principally explained as to the case of application to a ROM device, the invention is not restricted thereto, but it is also applicable to any other memory structure in which MOSFETs are arrayed in a checkered pattern, and to the formation of a logic circuit or any other ordinary circuit based on the presence or absence of contact holes.

I claim:

1. A read only memory array, comprising:
   (a) a plurality of memory cells arrayed in a matrix in a semiconductor substrate, with two of said memory cells comprising two MISFETs having source and drain regions spaced from each other in a direction vertical to a main surface of said semiconductor substrate, and two gate electrodes being buried in parallel in a groove extending in a first direction and located between source/drain regions for adjacent memory cells, said groove having gate insulator films for said gate electrodes on an inner surface of said groove;
   (b) data lines, extending in a direction perpendicular to the first direction, the data lines being located over the semiconductor substrate; and
   (c) word lines, buried in said groove and including said gate electrodes, two of said word lines in one groove being selected independently.

2. A read only memory array as defined in claim 1, wherein said insulator film is an $SiO_2$ film, and said gate electrodes are of doped polycrystalline silicon.

3. A read only memory array as defined in claim 1, wherein the source region or the drain region of the MISFETs is formed in an upper layer, relative to the direction vertical to the main surface of said semiconductor substrate, as compared to the layer in which the other of said source and drain regions is formed, and wherein predetermined upper layers are connected to said data lines.

4. A read only memory array as defined in claim 1, wherein the source region or the drain region of the MISFETs is formed in an upper layer, relative to the direction vertical to the main surface of said semiconductor substrate, as compared to the layer in which the other of said source and drain regions is formed, and wherein each upper layer is connected to said data lines and said MISFETs have unequal threshold voltages.

5. A read only memory array having word lines extending in a first direction and data lines extending in a second direction intersecting the first direction, comprising:
   a semiconductor substrate;
   a plurality of active regions extending in said first direction;
   a plurality of first grooves being formed in a direction vertical to a main surface of said semiconductor substrate between said active regions and extending in said first direction;
   a plurality of MISFETs arrayed in a matrix in said semiconductor substrate, each MISFET having a gate electrode being buried in said first groove and a source region and a drain region spaced from each other in a direction vertical to said main surface of said semiconductor substrate, and two gate electrodes of said MISFETs being formed in each first groove;
   data lines, extending in said second direction; and
   word lines, buried in said first grooves and including said gate electrodes, two of said word lines in one groove being selected independently.

6. A read only memory array as defined in claim 5, wherein said active regions are divided by a plurality of second grooves extending in said second direction.

7. A read only memory array as defined in claim 5, wherein said active regions are divided by a plurality of insulator films extending in said second direction.

8. A read only memory array as defined in claim 5, wherein the active regions are divided by element isolating means extending in said second direction.

9. A read only memory array as defined in claim 8, wherein said first grooves are located at opposed sides of each active region, with gate electrodes buried in said first grooves at opposed sides of each active region such that the MISFETs having the respective gate electrodes in the first grooves share a common active region, the MISFETs having the two gate electrodes at the opposed sides of each active region being selected together.

10. A read only memory array as defined in claim 9, wherein said gate electrodes are of doped polycrystalline silicon.

11. A read only memory array as defined in claim 9, wherein said active regions are comprised of upper and lower impurity layers acting as said source region and said drain region, and wherein predetermined upper layers of said active regions are connected to data lines.

12. A read only memory array as defined in claim 9, wherein said active regions are comprised of upper and lower impurity layers acting as said source region and said drain region, and wherein each upper layer is connected to said data lines and said MISFETs have unequal threshold voltages.

13. A read only memory array as defined in claim 8, wherein said active regions are comprised of upper and lower impurity layers acting as said source region and said drain region, and wherein the upper layer of each active region is divided by a further groove.

14. A read only memory array as defined in claim 13, wherein said first grooves are located at opposed sides of each active region, with gate electrodes buried in said first grooves at opposed sides of each active region such that the MISFETs having the respective gate electrodes in the first grooves share a common active region, the MISFETs having the two gate electrodes at the opposed sides of each active region being selected independently.

15. A read only memory array as defined in claim 14, wherein said gate electrodes are of doped polycrystalline silicon.

16. A read only memory array as defined in claim 14, wherein predetermined upper layers of said active regions are connected to data lines.

17. A read only memory array as defined in claim 14, wherein each upper layer is connected to said data lines and said MISFETs have unequal threshold voltages.

* * * * *